United States Patent
Na et al.

(10) Patent No.: US 9,787,111 B2
(45) Date of Patent: Oct. 10, 2017

(54) BATTERY PROTECTION MODULE PACKAGE

(71) Applicant: ITM SEMICONDUCTOR CO., LTD, Cheongwon-gun, Chungcheongbuk-do (KR)

(72) Inventors: Hyeok Hwi Na, Cheongju-si (KR); Ho Suk Hwang, Gunpo-si (KR); Young Seok Kim, Cheongju-si (KR); Sung Beum Park, Guri-si (KR); Sang Hoon Ahn, Cheongju-si (KR); Tae Hwan Jung, Chungcheongbuk-do (KR); Seung Uk Park, Cheonan-si (KR); Jae Ku Park, Chungcheongbuk-do (KR); Hyun Mok Cho, Cheongju-si (KR); Min Ho Park, Chungcheongbuk-do (KR); Young Geun Yoon, Chungcheongbuk-do (KR); Seong Ho Ju, Daejeon (KR); Young Nam Ji, Cheongju-si (KR); Myoung Ki Moon, Chungcheongbuk-do (KR); Hyun Suck Lee, Jecheon-si (KR); Ji Young Park, Busan (KR)

(73) Assignee: ITM SEMICONDUCTOR CO., LTD, Oksan-myeon, Cheongwon-gun (KR)

( * ) Notice: Subject to any disclaimer, the term of this patent is extended or adjusted under 35 U.S.C. 154(b) by 120 days.

(21) Appl. No.: 14/652,855

(22) PCT Filed: Dec. 13, 2013

(86) PCT No.: PCT/KR2013/011562
§ 371 (c)(1),
(2) Date: Jun. 17, 2015

(87) PCT Pub. No.: WO2014/098414
PCT Pub. Date: Jun. 26, 2014

(65) Prior Publication Data
US 2015/0333548 A1 Nov. 19, 2015

(30) Foreign Application Priority Data

Dec. 17, 2012 (KR) .................. 10-2012-0147380

(51) Int. Cl.
*H05K 7/00* (2006.01)
*H02J 7/00* (2006.01)
(Continued)

(52) U.S. Cl.
CPC ............ *H02J 7/0031* (2013.01); *H01M 2/34* (2013.01); *H02J 7/0042* (2013.01);
(Continued)

(58) Field of Classification Search
USPC ........................................ 361/699, 760, 101
See application file for complete search history.

(56) References Cited

U.S. PATENT DOCUMENTS

| | | | |
|---|---|---|---|
| 2006/0257723 A1 | 11/2006 | Tan et al. | |
| 2007/0063340 A1* | 3/2007 | Owyang | ................. H01L 23/36 257/723 |
| 2009/0008758 A1* | 1/2009 | Lu | ..................... H01L 21/82348 257/676 |

FOREIGN PATENT DOCUMENTS

| | | |
|---|---|---|
| CN | 1732722 A | 2/2006 |
| JP | 2006-059553 A | 3/2006 |

(Continued)

*Primary Examiner* — Danny Nguyen
(74) *Attorney, Agent, or Firm* — Novick, Kim & Lee, PLLC; Sang Ho Lee

(57) ABSTRACT

Disclosed is a battery protection module package (PMP). The battery PMP according to an embodiment of the present invention includes a lead frame provided with a plurality of external terminals thereon, a printed circuit board stacked on the lead frame, and a plurality of internal terminals, a protection integrated chip (IC), a field effect transistor (FET), resistors, and capacitors disposed on the printed circuit board and electrically connected to each other, (Continued)

wherein the resistors and the capacitors are mounted on a pattern of the printed circuit board using surface mount technology (SMT), and wherein the plurality of internal terminals are electrically connected to the plurality of external terminals.

15 Claims, 13 Drawing Sheets

(51) Int. Cl.
    *H01M 2/34*     (2006.01)
    *H01L 23/495*     (2006.01)

(52) U.S. Cl.
    CPC ... *H01L 23/49575* (2013.01); *H01M 2200/00* (2013.01); *H02J 2007/004* (2013.01); *H02J 2007/0037* (2013.01); *H02J 2007/0039* (2013.01)

(56) References Cited

FOREIGN PATENT DOCUMENTS

| JP | 2006-187185 A | 7/2006 |
|----|---------------|--------|
| JP | 2007-049098 A | 2/2007 |
| JP | 2012-114019 A | 6/2012 |

\* cited by examiner

BATTERY PROTECTION MODULE PACKAGE

TECHNICAL FIELD

The present invention relates to a battery protection module package (PMP).

BACKGROUND ART

Mobile devices such as mobile phones and portable computers use batteries. The batteries are heated when overcharge or overcurrent occurs. If heating is continued and thus temperature is increased, the batteries exhibit performance degradation and even have risks of explosion.

As such, a typical battery has a protection circuit module for sensing and blocking overcharge, overdischarge, and overcurrent, or uses an external protection circuit for sensing overcharge, overdischarge, and heating to block operation of the battery.

FIG. 1 is a structural view of a conventional battery protection module package (PMP). The conventional battery PMP is modified and developed from a generally used battery protection circuit module (PCM), and replaces the battery PCM by mounting various devices inside the package.

Referring to FIG. 1, the conventional battery PMP includes a plurality of external terminals 106 provided on a lead frame 102 including connection parts 104 for connecting the package to a battery, and a plurality of internal terminals, a protection integrated circuit (IC) 110, a field effect transistor (FET) 112, resistors 114, and capacitors 116 for protecting the battery. Since the connection parts 104 are excessively long and a region for the external terminals 106 and a region for the internal circuits 108 to 114 are separate from each other, the conventional battery PMP has a large size and volume.

DETAILED DESCRIPTION OF THE INVENTION

Technical Problem

The present invention provides a small battery protection module package (PMP) capable of efficiently protecting a battery from overdischarge, overcharge and overcurrent of the battery and having a smaller size than a conventional battery PMP to reduce battery size and production costs The other objects and advantages of the present invention can be understood and will become clearer through embodiments disclosed in the detailed description of the invention. In addition, it can be understood that the objects and advantages of the present invention will be implemented by constructions and features disclosed in the claims and a combination thereof.

Technical Solution

According to an aspect of the present invention, there is provided a battery protection module package (PMP) including a lead frame provided with a plurality of external terminals thereon, a printed circuit board stacked on the lead frame, and a plurality of internal terminals, a protection integrated chip (IC), a field effect transistor (FET), resistors, and capacitors disposed on the printed circuit board and electrically connected to each other, wherein the resistors and the capacitors are mounted on a pattern of the printed circuit board using surface mount technology (SMT), and wherein the plurality of internal terminals are electrically connected to the plurality of external terminals.

Advantageous Effects

A small battery protection module package (PMP) according to the present invention may efficiently protect a battery from overdischarge, overcharge and overcurrent of the battery and have a smaller size than a conventional battery PMP to reduce battery size and production costs.

In addition, according to the present invention, a production process of the battery PMP may be simplified, battery life may be increased due to reduction in resistance inside the battery PMP, and an extra space due to a small size of the battery PMP may lead to an increase in battery capacity.

BEST MODE

Figure 1:
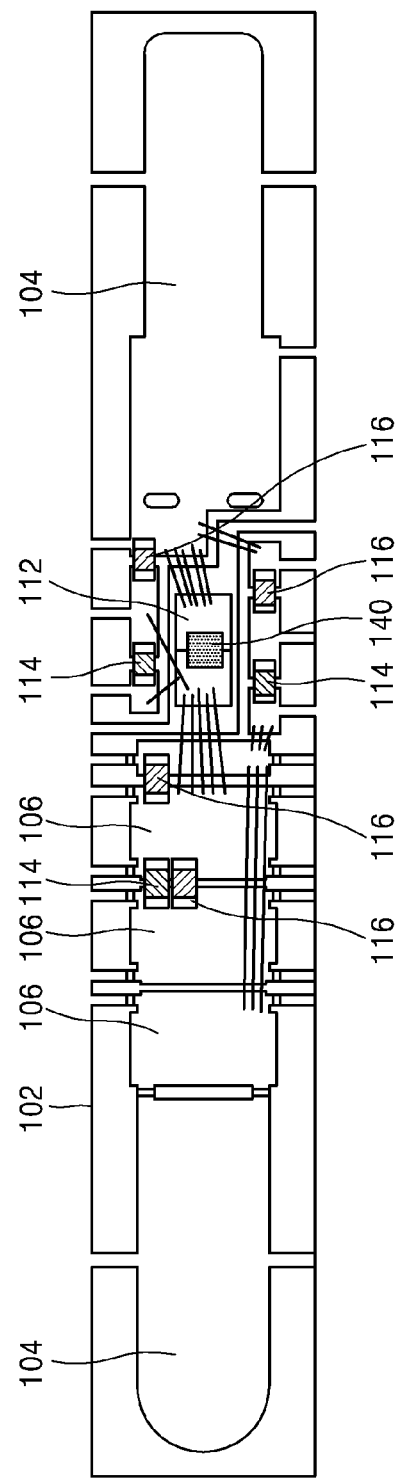
FIG. 1 is a structural view of a conventional battery protection module package (PMP).

The objects and advantages of the present invention can be understood and become clearer through embodiments disclosed in the detailed description of the invention. Accordingly, the technical features of the present invention can be implemented by one of ordinary skill in the art. In the following description of the present invention, a detailed description of known functions and configurations incorporated herein will be omitted when it may make the subject matter of the present invention unclear. Hereinafter, the present invention will be described in detail by explaining embodiments of the invention with reference to the attached drawings. Like reference numerals in the drawings denote like elements.

Figure 2:
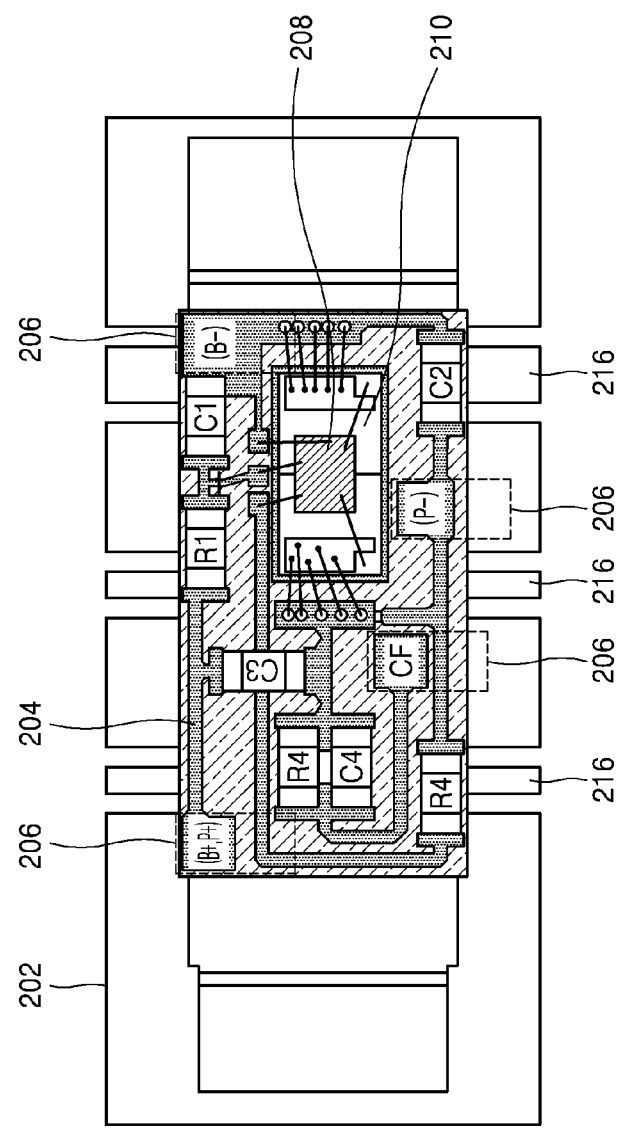
FIG. 2 is a structural view of a small battery PMP according to the present invention.

FIG. 2 is a structural view of a small battery protection module package (PMP) according to the present invention.

Referring to FIG. 2, the small battery PMP according to the present invention includes a lead frame 202 provided with a plurality of external terminals thereon 216, a printed circuit board 204 stacked on the lead frame 202, and a plurality of internal terminals 206, a protection integrated chip (IC) 208, a field effect transistor (FET) 210, resistors R1 to R4, and capacitors C1 to C4 disposed on the printed circuit board 204 and electrically connected to each other.

In the conventional battery PMP of FIG. 1, the region for the external terminals 106 and the region for the internal circuits 110 to 114 are separate from each other. As such, the total size of the package is increased.

To solve the above problem, in the present invention, the printed circuit board 204 is stacked on a region for the external terminals 216 of the lead frame 202 as illustrated in FIG. 2. Due to this stacking process, the small battery PMP according to the present invention may have a size equal to or less than ½ of the conventional battery PMP.

Meanwhile, in the current embodiment of the present invention, the printed circuit board 204 may be stacked on the lead frame 202 using a non-conductive adhesive. Examples of the non-conductive adhesive used in this case include an epoxy resin adhesive, a silicon adhesive, a resin adhesive, a rubber-based adhesive, a polyimide-based insulating adhesive, and insulating tape, but are not limited thereto.

Figure 3:
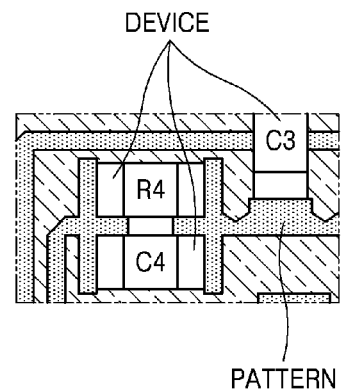
FIG. 3 illustrates devices mounted on the pattern of a printed circuit board using surface mount technology (SMT), according to an embodiment of the present invention.

FIG. 3 illustrates a device pattern on the printed circuit board 204 according to an embodiment of the present invention. As illustrated in FIG. 3, devices such as the resistors R1 to R4 and the capacitors C1 to C4 may be mounted on the pattern of the printed circuit board 204 using surface mount technology (SMT).

Figure 4:
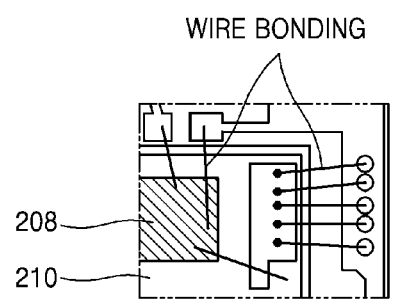
FIG. 4 is a view for describing a method for connecting a protection integrated chip (IC) to a field effect transistor (FET), according to an embodiment of the present invention.

FIG. 4 is a view for describing a method for connecting the protection IC 208 to the FET 210, according to an embodiment of the present invention. Referring to FIG. 4, the protection IC 208 stacked on the FET 210, and the FET 210 may be electrically connected to each other through wire bonding.

Figure 5:
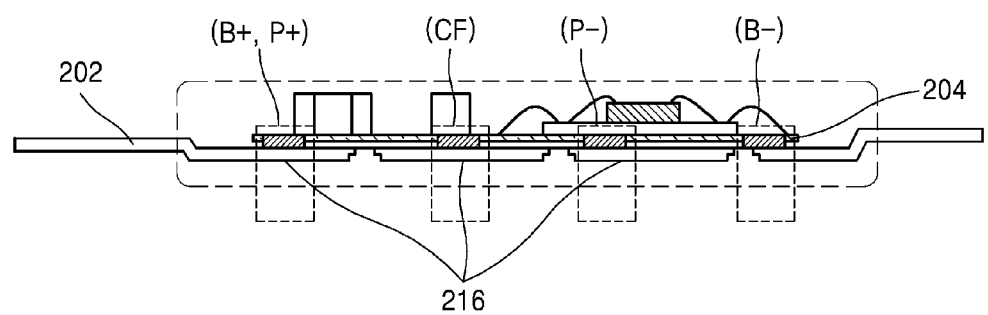
FIG. 5 illustrates external terminals and internal terminals provided on the small battery PMP according to the present invention.

FIG. 5 illustrates the external terminals 216 and the internal terminals 206 provided on the small battery PMP according to the present invention. To operate the small battery PMP, the external terminals 216 provided on the lead frame 202 and the internal terminals 206 provided on the printed circuit board 204 should be electrically connected to each other as illustrated in FIG. 5.

Figure 6:
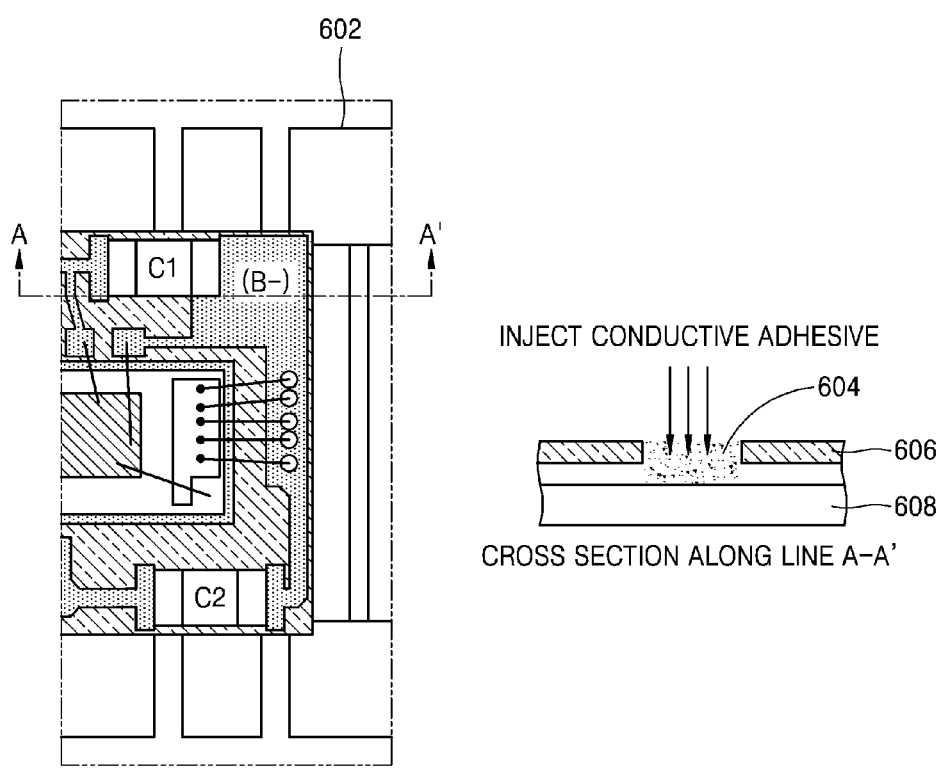
FIG. 6 is a view for describing a method for connecting an external terminal to an internal terminal, according to an embodiment of the present invention.

FIG. 6 is a view for describing a method for connecting an external terminal 608 to an internal terminal 606, according to an embodiment of the present invention. Referring to a cross-sectional view at the right side of FIG. 6, a via hole 604 is formed in a printed circuit board. In the current embodiment of the present invention, by injecting a conductive adhesive into the via hole 604, the internal terminal 606 provided on the printed circuit board near the via hole 604 may be electrically connected to the external terminal 608. Examples of the conductive adhesive injected in this case include solder cream, a silicon adhesive, a polyimide-based conductive adhesive, and a thermoplastic conductive adhesive, but are not limited thereto.

Figure 7:
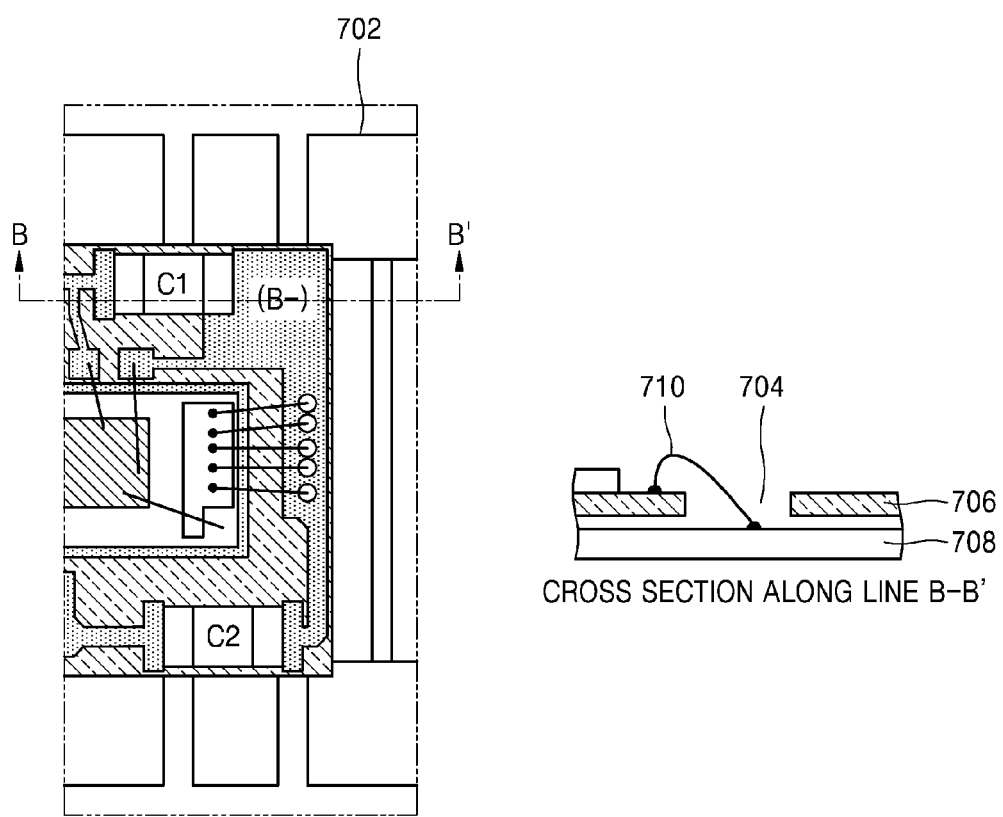
FIG. 7 is a view for describing a method for connecting an external terminal to an internal terminal, according to another embodiment of the present invention.

FIG. 7 is a view for describing a method for connecting an external terminal 708 to an internal terminal 706, according to another embodiment of the present invention. In the current embodiment of the present invention, the external terminal 708 and the internal terminal 706 may be bonded and electrically connected to each other using a wire 710 as illustrated in a cross-sectional view at the right side of FIG. 7. In this case, the wire 710 is connected to the external terminal 708 through a hole 704 formed in the internal terminal 706. In the current embodiment of the present invention, the number of wires 710 for interconnecting the external terminal 708 and the internal terminal 706 in FIG. 7 may be equal to or greater than 1.

Figure 8:
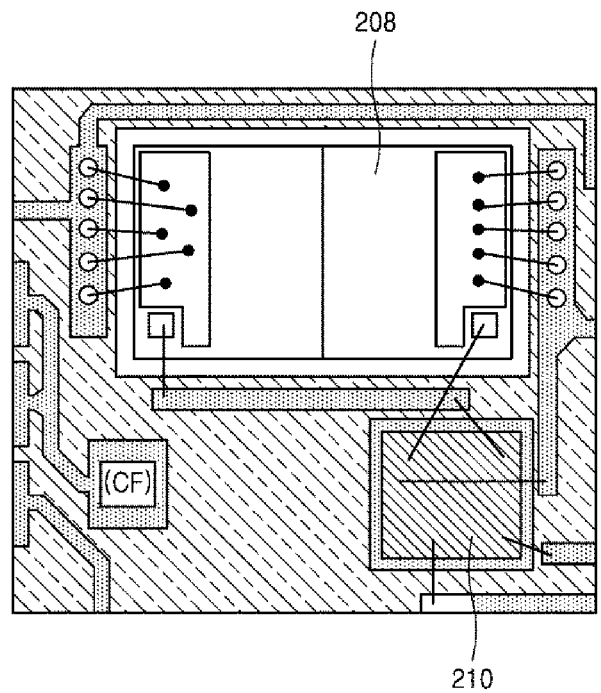
FIG. 8 is a view for describing a method for connecting a protection IC to a FET, according to another embodiment of the present invention.

FIG. 8 is a view for describing a method for connecting a protection IC to a FET, according to another embodiment of the present invention. In the current embodiment of the present invention, the protection IC and the FET may be disposed in a parataxis type as illustrated in FIG. 8.

Figure 9:
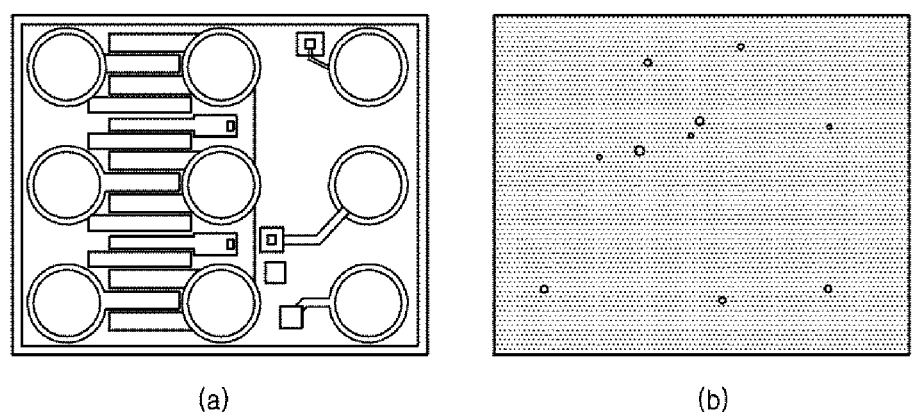
FIG. 9 shows top (a) and bottom (b) views of a protection IC and a FET configured as flip chips, according to another embodiment of the present invention.

FIG. 9 shows a top view (See (a) of FIG. 9) and a bottom view (See (b) of FIG. 9) of a protection IC and a FET configured as flip chips, according to another embodiment of the present invention. In the current embodiment of the present invention, the protection IC and the FET may be configured as flip chips as illustrated in FIG. 9. In this flip chip configuration, the protection IC and the FET may be electrically connected to each other using solder balls instead of wire bonding.

Meanwhile, in the current embodiment of the present invention, the printed circuit board 204 may be formed of glass or ceramic. A glass substrate has excellent characteristics in smoothness, thermal expansion coefficient, surface hardness, etc. A ceramic substrate has excellent characteristics in heat dissipation and resistance to physical deformation at high temperature. In the current embodiment of the present invention, the printed circuit board 204 may be made of the same material as the lead frame 202.

Figure 10:
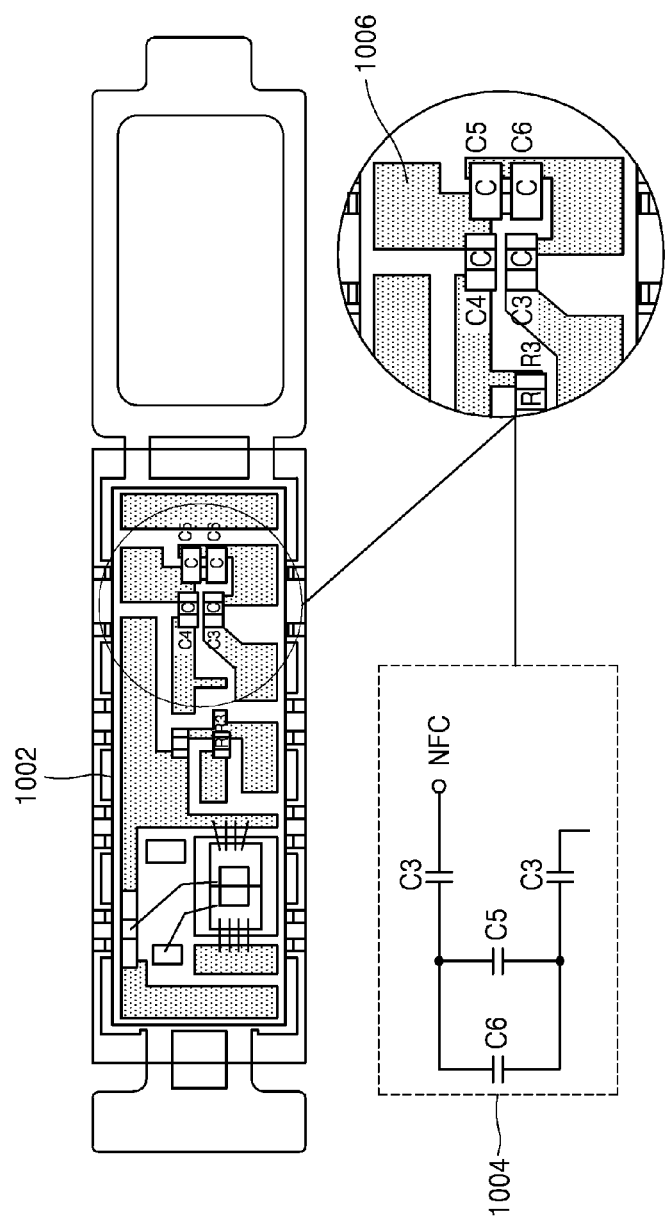
FIG. 10 is a structural view of a small battery PMP to which a near field communication (NFC) antenna circuit is added, according to an embodiment of the present invention.

FIG. 10 is a structural view of a small battery PMP to which a near field communication (NFC) antenna circuit 1006 is added, according to an embodiment of the present invention.

As described above, the small battery PMP according to the present invention has a structure in which a printed circuit board 1002 is stacked on a lead frame. As such, a circuit device other than typical devices may be additionally mounted on the printed circuit board 1002. In the current embodiment of the present invention, the NFC antenna circuit 1006 for connection to an NFC antenna may be mounted on the printed circuit board 1002 as illustrated in FIG. 10. Here, the NFC antenna circuit 1006 may be mounted on the printed circuit board 1002 using SMT as described above. This NFC antenna circuit 1006 includes a first capacitor C3, a second capacitor C4, and a third capacitor C5 connected to each other in series, and a fourth capacitor C6 connected in parallel to the third capacitor C5 as illustrated in a circuit diagram 1004 of FIG. 10.

Figure 11A:
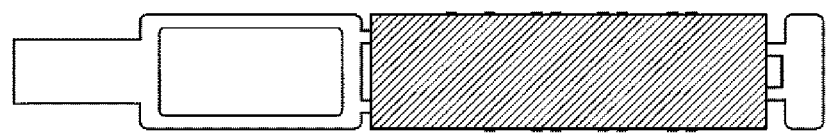
FIG. 11A is a structural view of a small battery PMP to which NFC antenna connection terminals are added, according to an embodiment of the present invention.
Figure 11A:
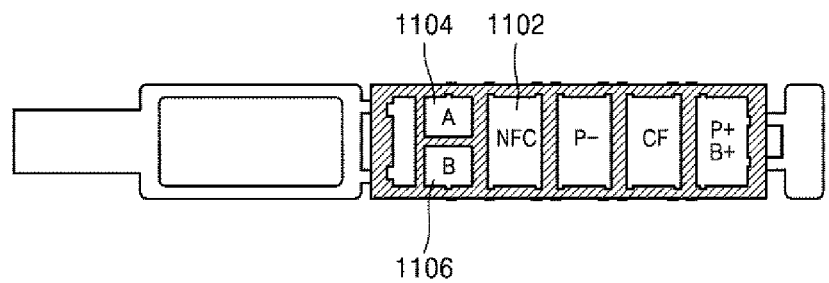

FIG. 11A is a structural view of a small battery PMP to which NFC antenna connection terminals are added, according to an embodiment of the present invention.

(a) and (b) of FIG. 11A are top and bottom views of a small battery PMP according to an embodiment of the present invention. Referring to FIG. 11A, the small battery PMP according to the current embodiment of the present invention may further include an external NFC antenna terminal 1102 for connecting a mobile device (e.g., a mobile phone) having a battery, to the battery PMP, and internal NFC antenna terminals 1104 and 1106 for electrically connecting an NFC antenna to the battery PMP.

As illustrated in FIG. 11A, in the current embodiment of the present invention, the internal NFC antenna terminals 1104 and 1106 may be disposed on a bottom surface of the small battery PMP.

Figure 11B:
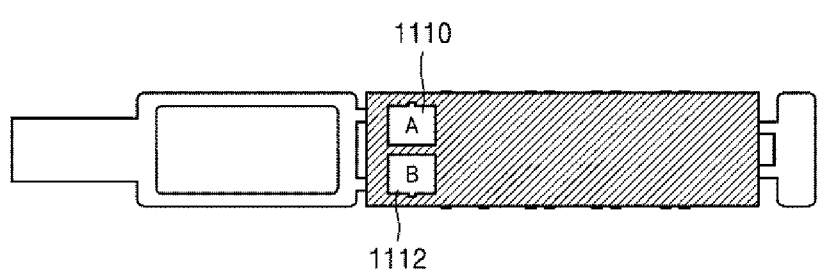
FIG. 11B is a structural view of a small battery PMP to which NFC antenna connection terminals are added, according to another embodiment of the present invention.
Figure 11B:
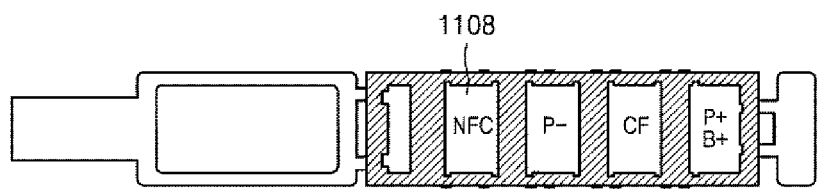

FIG. 11B is a structural view of a small battery PMP to which NFC antenna connection terminals are added, according to another embodiment of the present invention.

Referring to FIG. 11B, the small battery PMP according to the current embodiment of the present invention may further include an external NFC antenna terminal 1108 and internal NFC antenna terminals 1110 and 1112.

As illustrated in FIG. 11B, in the current embodiment of the present invention, the internal NFC antenna terminals 1110 and 1112 may be disposed on a top surface of the small battery PMP.

Figure 12:
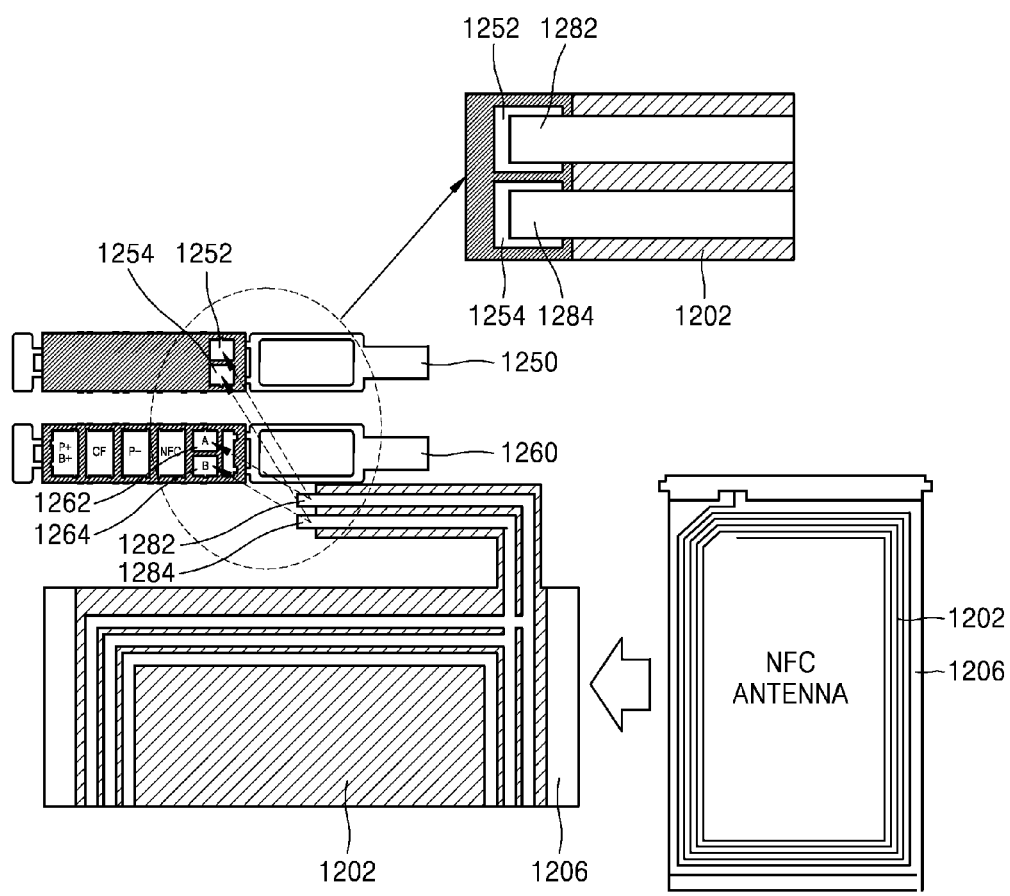
FIG. 12 is a diagram showing connection states between NFC antenna connection terminals and an NFC antenna, according to an embodiment of the present invention.

FIG. 12 is a diagram showing connection states between NFC antenna connection terminals 1252 and 1254 or 1262 and 1264, and an NFC antenna 1202, according to an embodiment of the present invention.

FIG. 12 illustrates a small battery PMP 1260 in which the NFC antenna connection terminals 1262 and 1264 are disposed on a top surface thereof, and a small battery PMP 1250 in which the NFC antenna connection terminals 1252 and 1254 are disposed on a bottom surface thereof.

Referring to FIG. 12, the NFC antenna 1202 is mounted on a surface of a battery 1206. In this case, NFC antenna terminals 1282 and 1284 are electrically connected to the NFC antenna connection terminals 1252 and 1254 or the NFC antenna connection terminals 1262 and 1264 according to the current embodiment of the present invention. In the current embodiment of the present invention, the NFC antenna terminals 1282 and 1284 of the NFC antenna 1202 may be connected to the NFC antenna connection terminals 1252 and 1254 or the NFC antenna connection terminals 1262 and 1264 through soldering.

Figure 13:
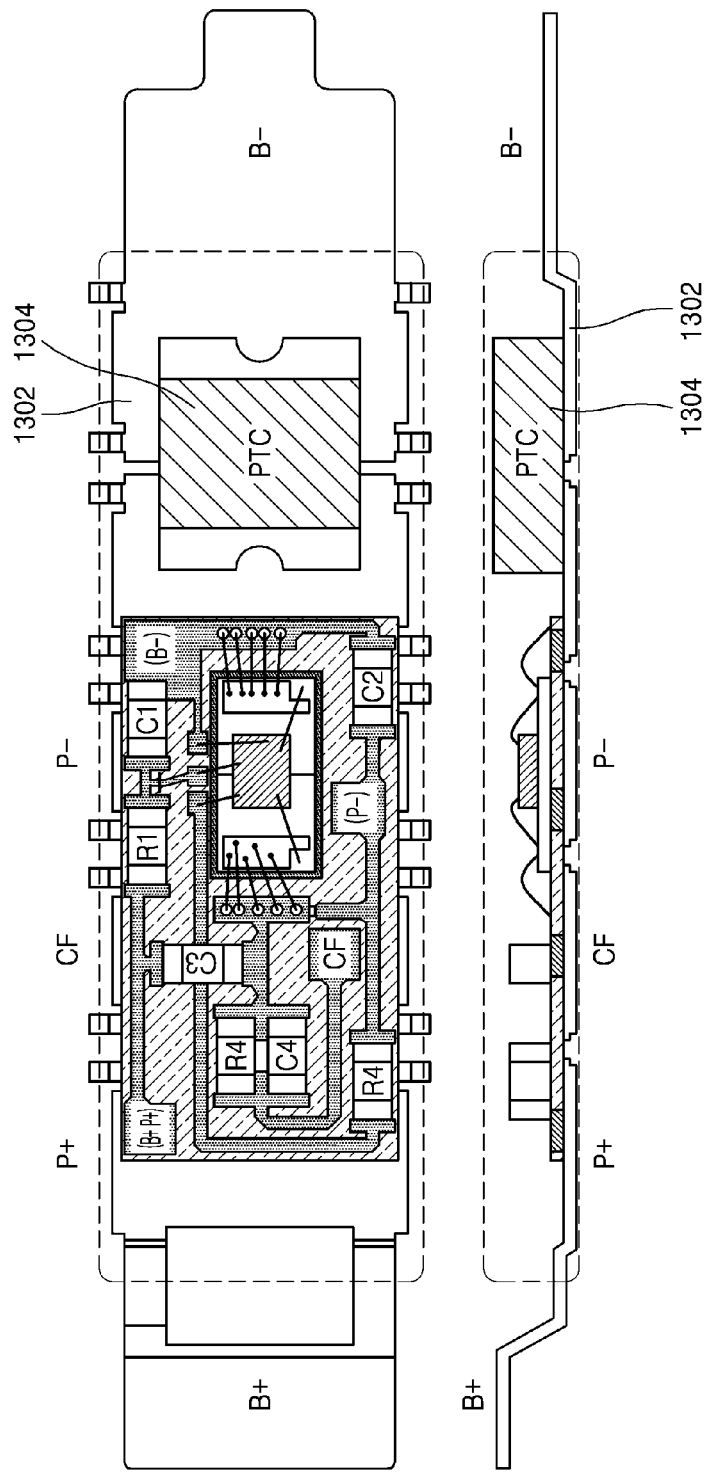
FIG. 13 is a structural view of a small battery PMP to which a positive temperature coefficient (PTC) thermistor is added, according to an embodiment of the present invention.

FIG. 13 is a structural view of a small battery PMP to which a positive temperature coefficient (PTC) thermistor 1304 is added, according to an embodiment of the present invention.

A PTC thermistor is a device which exhibits a rapidly increasing electrical resistance with an increase in temperature, and is a safe heating element replacing nichrome wire. The PCT thermistor functions as a switch when a resistance varies based on temperature.

In the current embodiment of the present invention, the PTC thermistor 1304 may be stacked on a lead frame 1302 as illustrated in FIG. 13. In FIG. 13, external terminals B+, P+, CF, P−, and B− are provided on the lead frame 1302, and the PTC thermistor 1304 is disposed near terminal B− of the lead frame 1302. Since the PTC thermistor 1304 is mounted inside the small battery PMP as described above, the total size of the package may be reduced.

Figure 14:
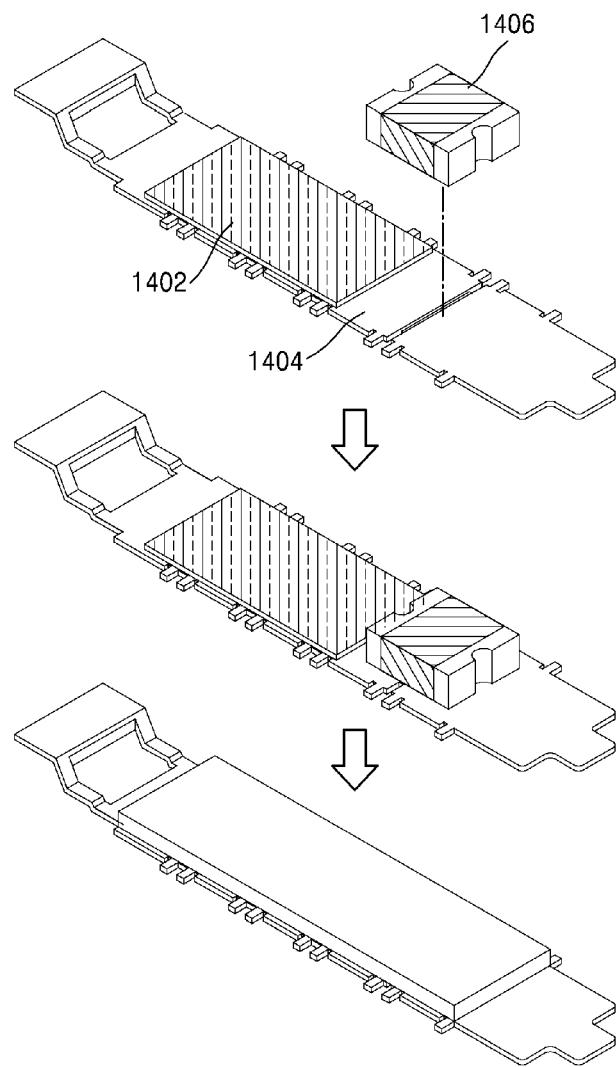
FIG. 14 is a view for describing a method for mounting a PTC thermistor on a small battery PMP, according to an embodiment of the present invention.

FIG. 14 is a view for describing a method for mounting a PTC thermistor 1404 on a small battery PMP, according to an embodiment of the present invention.

Referring to FIG. 14, like a printed circuit board 1402, the PTC thermistor 1404 is stacked on a lead frame 1406. In this case, like the printed circuit board 1402, the PTC thermistor 1404 may be mounted on the lead frame 1406 using SMT.

Figure 15:
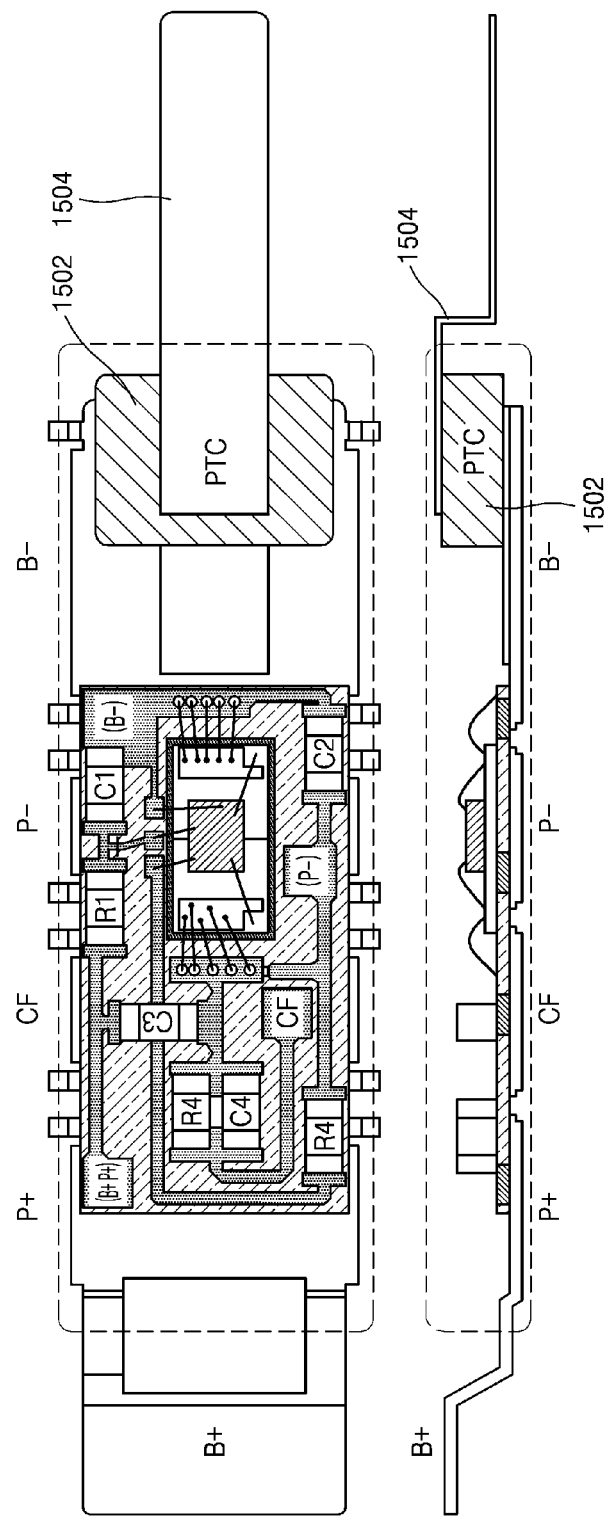
FIG. 15 is a structural view of a small battery PMP to which a PTC thermistor is added, according to another embodiment of the present invention.

FIG. 15 is a structural view of a small battery PMP to which a PTC thermistor 1502 is added, according to another embodiment of the present invention.

In the current embodiment of the present invention, the PTC thermistor 1502 is stacked on a lead frame as in FIG. 13. Although terminal B− is exposed on the lead frame in the previous embodiment of FIG. 13, a nickel (Ni) tap 1504 of the PTC thermistor 1502 is exposed in the current embodiment of FIG. 15 to function as conventional terminal B− provided on the lead frame.

Figure 16:
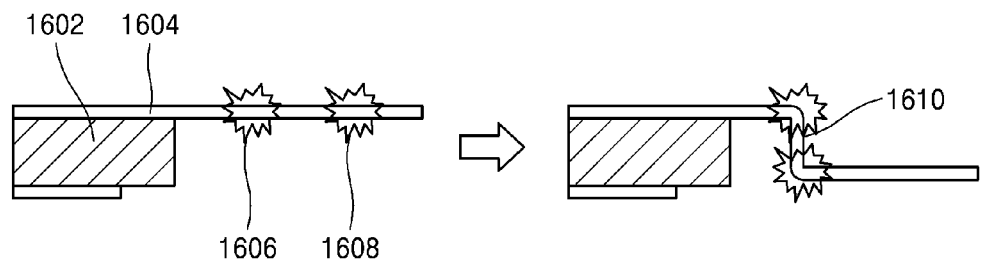
FIG. 16 is a diagram showing the shape of a nickel (Ni) tap of a PTC thermistor, according to another embodiment of the present invention.

FIG. 16 is a diagram showing the shape of a Ni tap 1604 of a PTC thermistor 1602, according to another embodiment of the present invention.

Referring to FIG. 16, a first part 1606 and a second part 1608 of the Ni tap 1604 of the PTC thermistor 1602 may be bent to use the Ni tap 1604 as terminal B−. Due to this bending process, a Ni tap 1610 functioning as terminal B− may be achieved as illustrated in FIG. 16. The reason why the Ni tap 1610 is formed in this shape is to make the Ni tap 1610 function as conventional terminal B− by controlling the height of the Ni tap 1610 to be equal to the height of the lead frame as illustrated in FIG. 15. In addition, since the first part 1606 and the second part 1608 of the Ni tap 1604 are bent as illustrated in FIG. 16, a small battery PMP may be better fitted to a battery. The shape of the Ni tap 1604 may vary based on the assembly type of the small battery PMP.

Figure 17:
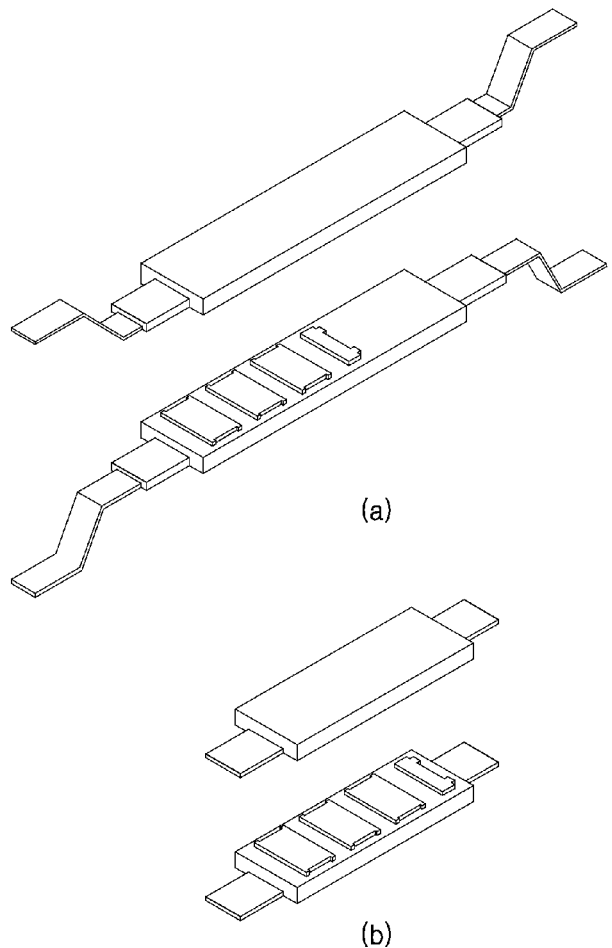
FIG. 17 is a diagram for comparing the size of a conventional battery PMP to the size of a small battery PMP according to the present invention.

FIG. 17 is a diagram for comparing the size of a conventional battery PMP a to the size of a small battery PMP b according to the present invention. As described above, the small battery PMP b according to the present invention has a smaller size and volume than the conventional battery PMP a and thus may reduce battery size and production costs.

In addition, according to the present invention, a production process of the battery PMP b may be simplified, battery life may be increased due to reduction in resistance inside the battery PMP b, and an extra space due to a small size of the battery PMP b may lead to an increase in battery capacity.

While the present invention has been particularly shown and described with reference to exemplary embodiments thereof, it will be understood by one of ordinary skill in the art that various changes in form and details may be made therein without departing from the spirit and scope of the present invention as defined by the following claims.

The invention claimed is:

1. A small battery protection module package (PMP) comprising:
   a lead frame provided with a plurality of external terminals thereon;
   a printed circuit board stacked on the lead frame; and
   a plurality of internal terminals, a protection integrated chip (IC), a field effect transistor (FET), resistors, and capacitors disposed on the printed circuit board and electrically connected to each other,
   wherein the resistors and the capacitors are mounted on a pattern of the printed circuit board using surface mount technology (SMT), and
   wherein the plurality of internal terminals are electrically connected to the plurality of external terminals.

2. The small battery PMP of claim 1, wherein the printed circuit board is stacked on the lead frame using a non-conductive adhesive.

3. The small battery PMP of claim 1, wherein via holes are formed in the plurality of internal terminals, and
wherein the plurality of internal terminals are electrically connected to the plurality of external terminals using a conductive adhesive injected into the via holes.

4. The small battery PMP of claim 1, wherein the plurality of internal terminals are electrically connected to the plurality of external terminals through wire bonding.

5. The small battery PMP of claim 1, wherein the protection IC is stacked on the FET.

6. The small battery PMP of claim 1, wherein the protection IC is disposed in a parataxis type with the FET.

7. The small battery PMP of claim 1, wherein the protection IC and the FET are configured as flip chips.

8. The small battery PMP of claim 1, wherein the printed circuit board is one of a glass substrate, a ceramic substrate, and a substrate made of the same material as the lead frame.

9. The small battery PMP of claim 1, wherein an external near field communication (NFC) antenna terminal for connecting an external device to the battery PMP, and internal NFC antenna terminals for electrically connecting an NFC antenna to the battery PMP are provided on the lead frame, and
wherein the internal NFC antenna terminals are disposed on a top or bottom surface of the small battery PMP.

10. The small battery PMP of claim 9, wherein the NFC antenna is electrically connected to the internal NFC antenna terminals through soldering.

11. The small battery PMP of claim 9, wherein a circuit for the NFC antenna comprises a first capacitor, a second capacitor, and a third capacitor connected to each other in series; and
a fourth capacitor connected in parallel to the third capacitor.

12. The small battery PMP of claim 1, wherein a positive temperature coefficient (PTC) thermistor is stacked on the lead frame.

13. The small battery PMP of claim 12, wherein the PTC thermistor is mounted on the lead frame using SMT.

14. The small battery PMP of claim 12, wherein the PTC thermistor comprises a nickel (Ni) tap functioning as an external terminal of the lead frame.

15. The small battery PMP of claim 14, wherein the Ni tap has a bent shape to have the same height as the lead frame, and
wherein the shape of the Ni tap is variable based on assembly type of the small battery PMP.

* * * * *